(12) United States Patent  
Burnett et al.

(10) Patent No.: US 7,754,560 B2
(45) Date of Patent: Jul. 13, 2010

(54) INTEGRATED CIRCUIT USING FINFETS AND HAVING A STATIC RANDOM ACCESS MEMORY (SRAM)

(75) Inventors: James D. Burnett, Austin, TX (US); Leo Mathew, Austin, TX (US); Byoung W. Min, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 734 days.

(21) Appl. No.: 11/328,779

(22) Filed: Jan. 10, 2006

(65) Prior Publication Data

US 2007/0158730 A1 Jul. 12, 2007

(51) Int. Cl.
*H01L 21/8244* (2006.01)
*H01L 29/78* (2006.01)

(52) U.S. Cl. .................. 438/212; 257/329; 257/369; 257/E21.661; 257/E29.262

(58) Field of Classification Search .......... 438/268, 438/212; 257/329, 369, E21.661, E29.262
See application file for complete search history.

(56) References Cited

U.S. PATENT DOCUMENTS

| | | | |
|---|---|---|---|
| 4,701,423 A | 10/1987 | Szluk | |
| 5,384,473 A | 1/1995 | Yoshikawa et al. | |
| 6,166,413 A | 12/2000 | Ono | |
| 6,765,303 B1 | 7/2004 | Krivokapic et al. | |
| 6,815,277 B2 | 11/2004 | Fried et al. | |
| 6,867,460 B1 | 3/2005 | Anderson et al. | |
| 6,909,147 B2 * | 6/2005 | Aller et al. | 257/347 |
| 6,987,289 B2 | 1/2006 | Nowak | |
| 6,992,354 B2 | 1/2006 | Nowak et al. | |
| 7,074,662 B2 | 7/2006 | Lee et al. | |
| 7,112,455 B2 | 9/2006 | Mathew et al. | |
| 7,214,576 B1 | 5/2007 | Kaneko et al. | |
| 7,224,029 B2 | 5/2007 | Anderson et al. | |
| 7,382,020 B2 * | 6/2008 | Liu et al. | 257/335 |
| 7,575,975 B2 | 8/2009 | Thean et al. | |
| 2004/0113207 A1 * | 6/2004 | Hsu et al. | 257/368 |
| 2004/0222477 A1 | 11/2004 | Aller et al. | |
| 2005/0239242 A1 * | 10/2005 | Zhu et al. | 438/199 |
| 2006/0068531 A1 * | 3/2006 | Breitwisch et al. | 438/149 |
| 2006/0151834 A1 * | 7/2006 | Anderson et al. | 257/347 |
| 2007/0093010 A1 * | 4/2007 | Mathew et al. | 438/182 |

OTHER PUBLICATIONS

Yang et al; "On the Integration of CMOS with Hybrid Crystal Orientations"; 2004 IEEE Symposium on VLSI Technology Digest of technical Papers; pp. 160-161.

(Continued)

*Primary Examiner*—Steven J Fulk

(57) ABSTRACT

An integrated circuit includes a logic circuit and a memory cell. The logic circuit includes a P-channel transistor, and the memory cell includes a P-channel transistor. The P-channel transistor of the logic circuit includes a channel region. The channel region has a portion located along a sidewall of a semiconductor structure having a surface orientation of (110). The portion of the channel region located along the sidewall has a first vertical dimension that is greater than a vertical dimension of any portion of the channel region of the P-channel transistor of the memory cell located along a sidewall of a semiconductor structure having a surface orientation of (110).

4 Claims, 4 Drawing Sheets

OTHER PUBLICATIONS

Doris et al; "A Simplified Hybrid Orientation Technology (SHOT) for High Performance CMOS" 2004 IEEE Symposium on VLSI Technology Digest of Technical Papers; pp. 86-87.

Search Report and Written Opinion in coordinationg PCT Application No. PCT/US06/61278 mailed Aug. 18, 2008.

Restriction mailed Dec. 12, 2007 on Related U.S. Appl. No. 11/328,594.

Rejection mailed Feb. 20, 2008 on Related U.S. Appl. No. 11/328,594.

Rejection mailed Jan. 7, 2009 on Related U.S. Appl. No. 11/328,594.

Final Rejection mailed Jun. 24, 2009 on Related U.S. Appl. No. 11/328,594.

Advisory Action mailed Sep. 4, 2009 on Related U.S. Appl. No. 11/328,594.

Rejection mailed Aug. 21, 2008 on Related U.S. Appl. No. 11/328,668.

Final Rejection mailed Mar. 4, 2009 on U.S. Appl. No. 11/328,668.

Rejection mailed Jun. 8, 2009 on Related U.S. Appl. No. 11/328,668.

Interview Summary filed Sep. 14, 2009 on Related U.S. Appl. No. 11/328,668.

PCT/US2006/061283 International Search Report, Sep. 10, 2008, 3 pages.

* cited by examiner

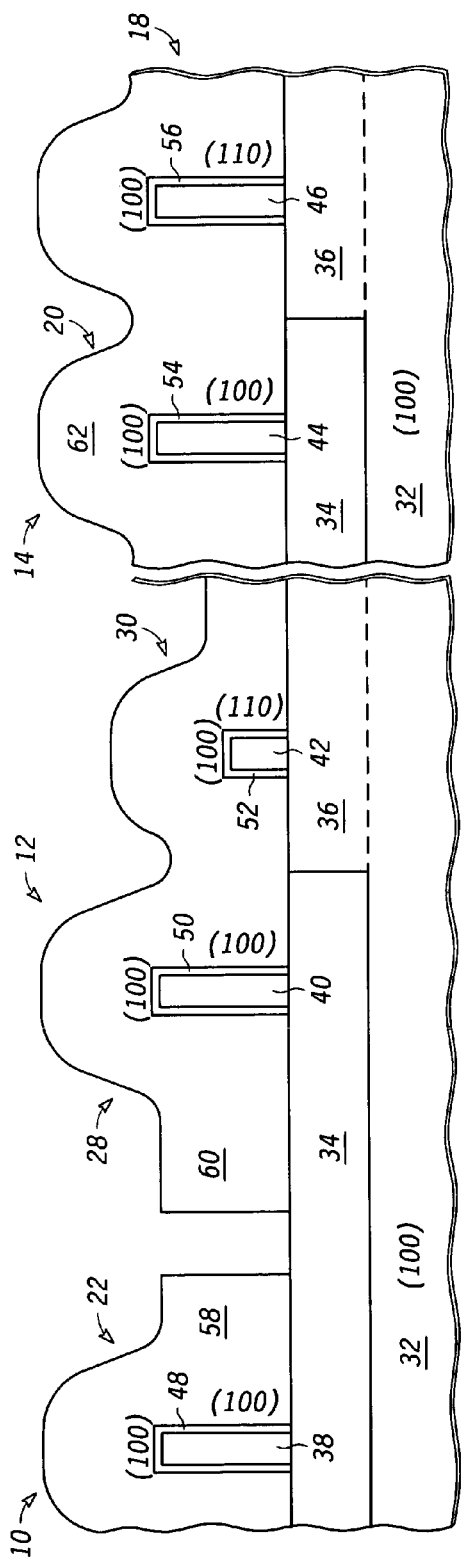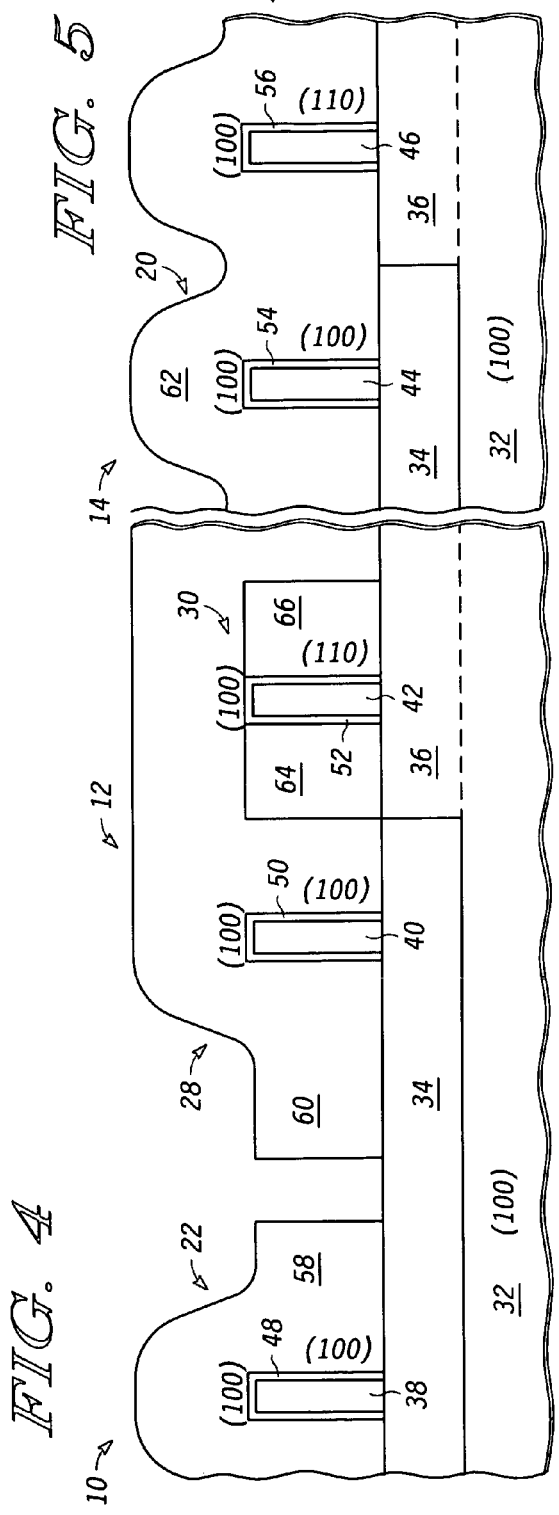

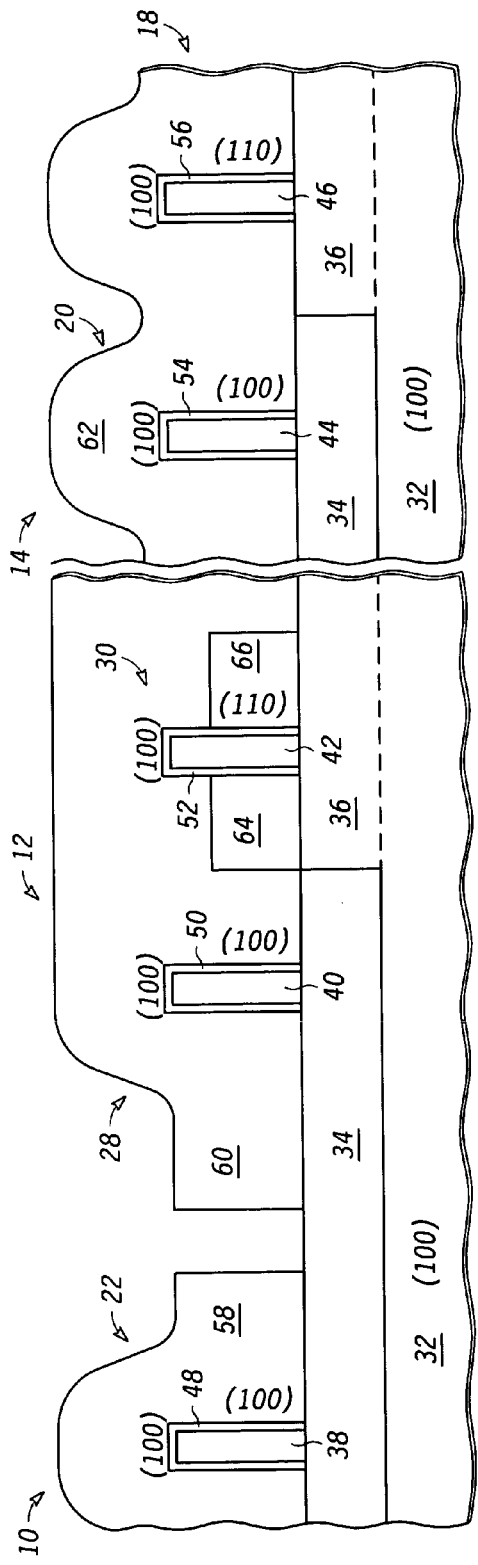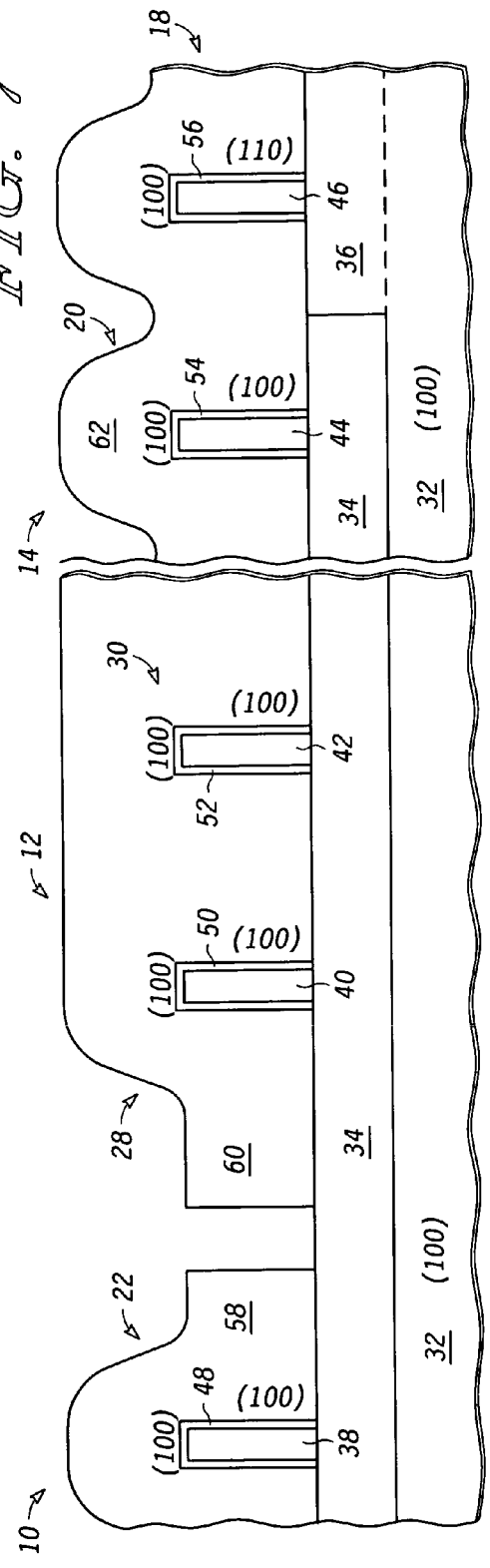

INTEGRATED CIRCUIT USING FINFETS AND HAVING A STATIC RANDOM ACCESS MEMORY (SRAM)

RELATED PATENT APPLICATIONS

This application is related to patent applications identified as follows:

U.S. patent application Ser. No. 11/328,668, titled "Process For Forming an Electronic Device Including a Fin-Type Structure," assigned to the assignee hereof, incorporated by reference, and filed on even date herewith; and U.S. patent application Ser. No. 11/328,594, titled "Electronic Device Including a Fin-Type Transistor Structure and a Process for Forming the Electronic Device," assigned to the assignee hereof, incorporated by reference, and filed on even date herewith.

FIELD OF THE INVENTION

This invention relates to integrated circuits, and more particularly, to a method of making integrated circuits using FinFETs and having a static random access memory (SRAM).

BACKGROUND OF THE INVENTION

The use of FinFETs is very attractive for manufacturing for increasing the density and electrical characteristics of MOS transistors. The fin rises above a substrate to function as the channel so that a major portion of the transistor is vertical and not lateral. The channel direction is lateral (carriers are transported horizontally) but in a structure that is above the surface of the substrate which saves space. Saving space is nearly always an important consideration, especially in memories such as static random access memories (SRAMs). Thus the ability to effectively implement FinFETs in an integrated circuit that has an SRAM is desired.

Thus, there is a need for having integrated circuits with onboard SRAM in which FinFETs are used effectively.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings:

FIG. 4 is a cross section of a portion of the logic and SRAM of the integrated circuit of FIG. 1 according to a first embodiment;

FIG. 5 is a cross section of a portion of the logic and SRAM of the integrated circuit of FIG. 1 according to a second embodiment;

FIG. 6 is a cross section of a portion of the logic and SRAM of the integrated circuit of FIG. 1 according to a first embodiment;

FIG. 7 is a cross section of a portion of the logic and SRAM of the integrated circuit of FIG. 1 according to a first embodiment.

DETAILED DESCRIPTION OF THE INVENTION

In one aspect an integrated circuit has a logic portion and an SRAM portion. The SRAM cells of the SRAM each have pull-up transistors, which are implemented as P channel transistors, and pass and pull-down transistors, which are implemented as N channel transistors. The logic also has P channel transistors which are implemented as FinFETs where the hole transport is in the horizontal direction. The P channel transistors that function as pull-ups in the array are made differently than the P channel transistors in the logic so as to have less current drive. This results in a more favorable ratio of current drive between the pass transistors and the pull-up transistors for the write operation. This is better understood by reference to the drawings and the following description.

Figure 1:
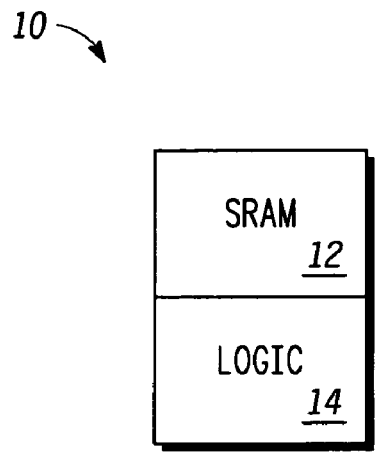
FIG. 1 shows an integrated circuit having logic and an SRAM which can effectively use FinFETs according to an embodiment of the invention.

Shown in FIG. 1 is an integrated circuit 10 comprising a SRAM portion 12 and a logic portion 14. Microcontrollers are an example of integrated circuit 10 that have substantial SRAM and logic portions.

Figure 2:
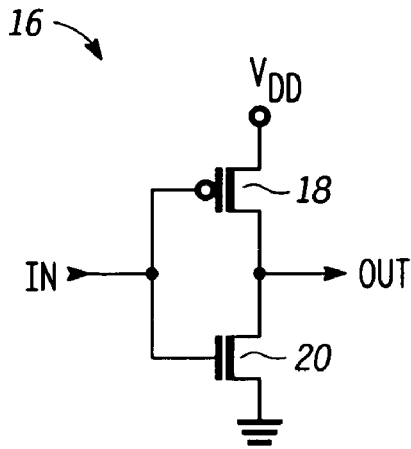
FIG. 2 is a circuit diagram of an inverter, as a basic building block for logic, which can be effectively used in conjunction with an SRAM for forming the integrated circuit of FIG. 1.

Shown in FIG. 2 an inverter 16, which is portion of logic portion 14 of integrated circuit 10. Inverter 16 has an P channel transistor 18 and an N channel transistor 20. Transistor 18 has a gate for receiving an input IN, a source connected to a positive power supply terminal VDD, and a drain. Transistor 20 has a gate for receiving input signal IN, a source connected to ground, and drain connected to the drain of transistor 18. The drains of transistors 18 and 20 provide an output OUT. Inverters are a fundamental building block of logic. Logic portion 14 has many P channel transistors such as transistor 18 as well as many transistors such as N channel transistor 20.

Figure 3:
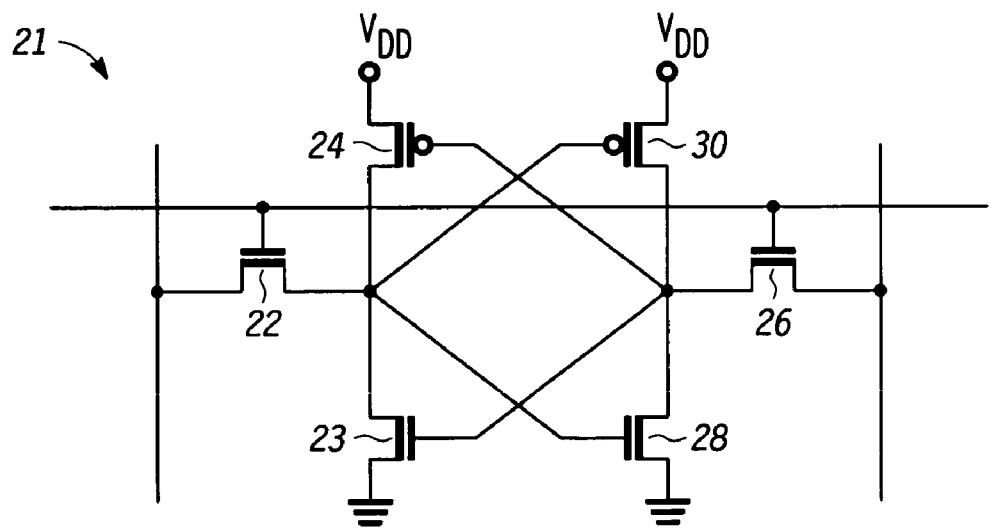
FIG. 3 is a circuit diagram of an SRAM cell which can be effectively used in conjunction with logic for forming the integrated circuit of FIG. 1.

Shown in FIG. 3 is a SRAM cell 21 of SRAM portion 18 comprising a pass transistor 22, a pull-down transistor 23, a pull-up transistor 24, a pass transistor 26, a pull-down transistor 28, and a pull-up transistor 30. Pass transistors 22 and 26 and pull-down transistors 23 and 28 are N channel transistors. Pull-up transistors 24 and 30 are P channel transistors. Transistors 28 and 30 form one inverter and transistors 23 and 24 form another inverter. The two inverters are cross-coupled to form a latch which functions as the storage element of the cell. One inverter has its input connected to a first current electrode of transistor 22 and its output connected to the first current electrode of transistor 26. The other inverter has its input connected to a first current electrode of transistor 26 and its output connected to the first current electrode of transistor 22. Transistor 22 has its second current electrode connected to one bit line of a bit line pair and its gate connected to a word line. Transistor 26 has its second current electrode connected to another bit line of the bit line pair and its gate connected to the word line. Typically, the dominant issue for an SRAM cell is how it is read. In such regards, an important factor is the ratio of the current drive of the pass transistors 22 and 26 to pull-down transistors 23 and 28.

Another issue, however, is writing the SRAM cell. This is just as critical because it is essential that a SRAM cell be reliably written. If the pull-up has too much current drive compared to the pass gate, it can be difficult to flip the state of the latch causing the write operation to be unreliable. To increase the current drive of the pass transistor can cause a problem with the read operation by adversely impacting the ratio of the current drive of the pull-down transistor to the current drive of the pass transistor.

Shown in FIG. 4 is cross section of a portion of semiconductor device 10 showing the inverter comprised of transistors 18 and 20 and a portion of the SRAM cell comprised of transistors 22, 28, and 30 over a semiconductor substrate 32.

Transistors 30 and 18 are the P channel transistors and transistors 20, 22, and 28 are the N channel transistors. In this example, transistors 20, 22, and 28 are made from fins 44, 38, and 40, respectively. P channel transistors 30 and 18 are made from fins 42 and 46, respectively. On fins 38, 40, 42, 44, and 46 are gate dielectrics 48, 50, 52, 54, and 56, respectively, which are preferably grown oxide but may be another material such as a high K dielectric. Between the N channel transistors 20, 22, and 28 and semiconductor substrate 32 is an insulating layer 34. Between P channel transistors 18 and 30 and semiconductor substrate 32 is an epitaxial layer 36. A gate 58, preferably of polysilicon, covers fin 38. A gate 60 covers fins 40 and 42. A gate 62 covers fins 44 and 46. Although the gates are currently preferably polysilicon, this is expected to change in the future to metal gates. The fins 38, 40, and 44 of the N channel transistors are formed by etching a starting material whose surface is in the (100) plane with the result that the sidewalls are in the (100) plane and the top of the fins is also the (100) plane. This can also be stated as the top of the fins has a surface orientation of (100). With regard to fins 42 and 46 that are used for the P channel transistors, epitaxial layer 36 has been etched to leave fins 42 and 46. Epitaxial layer 36 takes on the crystal plane of semiconductor substrate 32 from which it is grown. Although semiconductor substrate has its surface in the (100) plane, it is rotated 45 degrees compared to the semiconductor layer used to form fins 38, 40, and 44 so that the etch to form fins 42 and 46 results in those fins having a (110) plane on the sidewalls. This can also be called having a surface orientation of (110). This technique for forming fins of different sidewall planes is known in the art.

The (110) plane is known to be favorable for increased mobility for P channel transistors and thus it has been known to use P channel transistors having that plane on the sidewalls while having the (100) plane on the fin sidewalls for the N channel transistors. The increase in mobility, however, creates a problem for the pull-up transistor in the SRAM cell. The consequent increase in current drive due to the increase in mobility in the P channel pull-up transistor results in a problem in writing the SRAM cell. To overcome that problem, fin 42 is reduced in height compared to fin 46. Reducing the height causes the effective channel width of transistor 30 to be reduced thereby reducing current drive. Thus, in the embodiment of FIG. 4, integrated circuit 10 has the SRAM cells of the SRAM portion with pull-up transistors having a fin with a lower height than the fins of the P channel transistors in logic portion 14. A benefit of this is that the current drive ratio of the pass transistors to the pull-up transistors can be optimized. The height is selected for this optimization. An effective height is about half the height of the fins of the P channel transistors used for logic.

Shown in FIG. 5 is integrated circuit 10 with P channel pull-up transistor 30 having fin 42 at the same height as the fins of the P channel transistors used in logic portion 14 but has dielectric layer 64 along one sidewall and dielectric layer 66 along the other sidewall. Dielectric layers 64 and 66 are preferably sufficiently thick that they prevent the sidewalls of fin 42 functioning as a channel. Oxide layers of 500 Angstroms are effective for this purpose with gate voltages in the one volt range. With dielectric layers 64 and 66 along the sidewalls of fin 42, the effective channel width is about equal to the width of fin 42 along the top of fin 42. This beneficially reduces the current drive of P channel pull-up transistor 30. Insulating layers 64 and 66 can be formed by an oxide deposition before or after the gate dielectrics have been formed. The oxide deposition is patterned to leave dielectric layers 64 and 66. The alignment of the etch can be off center so long as each of dielectric layers 64 and 66 is sufficiently thick to avoid either or both of the sidewalls of fin 42 from becoming a channel. Although gate dielectric 52 is shown as being present, it is preferable to form the gate dielectrics after the patterning that forms dielectric layers 64 and 66 in which case gate dielectric 52 would not be adjacent to fin 42. Fin 46, which is for the logic P channel, of course does not have the thick dielectric along the sidewalls. P channel transistor 18 thus has a greater effective channel width than transistor 30.

Shown in FIG. 6 is semiconductor device 10 with a variation to the embodiment shown in FIG. 5 with dielectric layers 64 and 66 being reduced in height. This can be achieved by a blanket etch after the patterned etch that results in dielectric layers 64 and 66 as shown in FIG. 5. This way there is some channel along the sidewalls, which has the (110) plane, of fin 42 in addition to the channel along the top of fin 42. This provides for adjusting the effective channel width of the P channel pull-up transistors to actually optimize it to the extent desired.

As an alternative for achieving substantially the same structure for the embodiments of FIGS. 5 and 6 for P channel transistor 30, a sidewall spacer technique can be used in which a conformal layer of dielectric layer is deposited and then anisotropically etched. Using this technique a sidewall spacer analogous to dielectric layers 64 and 66 is formed around fin 42. The anisotropic etch can continue as long as desired in order to achieve the desired height of the dielectric layer. This is described in more detail in U.S. patent application Ser. No. 11/328,594 which is a related application and incorporated by reference.

Shown in FIG. 7 is another alternative for integrated circuit 10 in which the P channel pull-up is made differently than the logic P channel transistor to reduce the current drive of the P channel pull-up. In this case, the P channel pull-up has the same fin construction as the fin construction for the N channel transistors. Fin 42 in this case has both a (100) plane top and a (100) plane sidewall. Thus, transistor 30 does not have the enhanced mobility for P channel transistors that the (110) plane gives. The P channel logic transistor 18, however, does still have the enhanced mobility provided by the (110) plane along the sidewalls of fin 46. This provides a benefit of simplicity because no special treatment of fin 42 is required.

Figure 8:
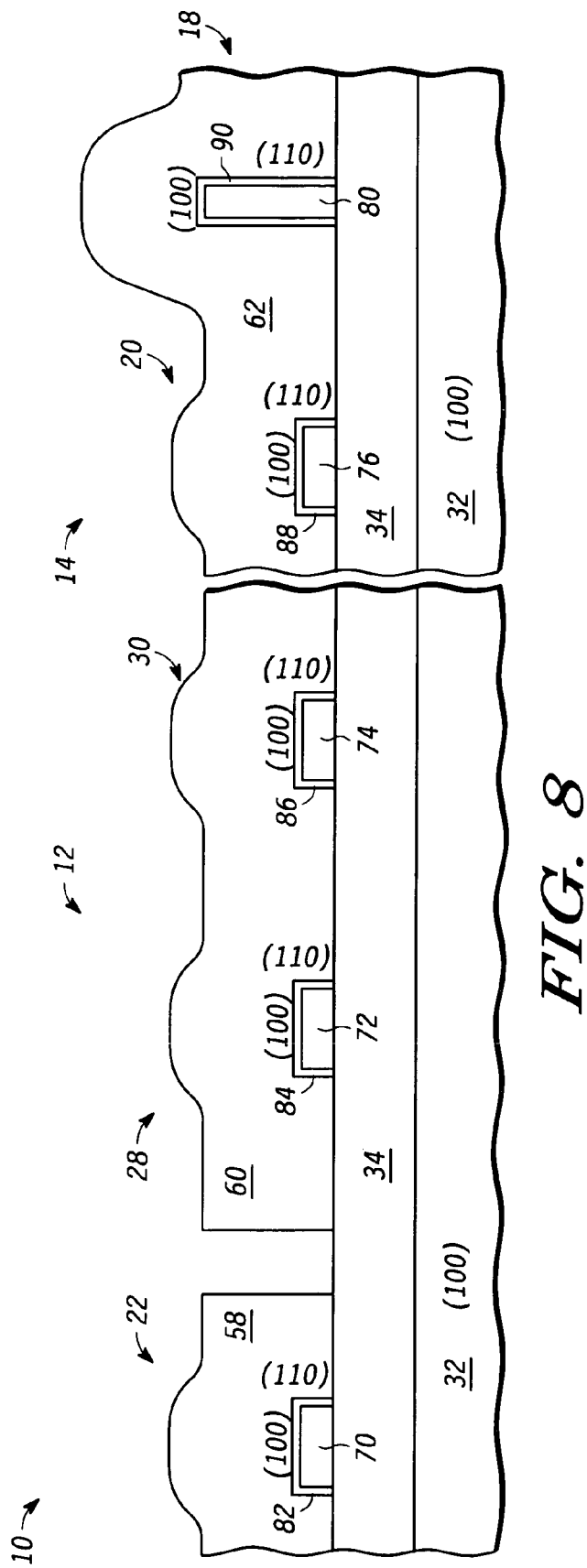
FIG. 8 is a cross section of a portion of the logic and SRAM of the integrated circuit of FIG. 1 according to a first embodiment.

Shown in FIG. 8 is integrated circuit 10 after using a somewhat different approach to providing the combination SRAM and logic in which the SRAM pull-up is made differently than the P channel logic device in order to provide a benefit in the write mode of the SRAM.

In this example, there is no need for the epitaxial growth because all of fins have a (100) plane on the top and a (110) plane on the sidewall. The N channel pull-down, pass, and logic transistors and the P channel pull-up are etched down to such an extent that the sidewalls are a minor portion of the channel. These transistors all have a (100) top surface which is beneficial for mobility for N channel transistors. The fins from which transistors 22, 28, 30, and 20 are made are much wider than the fins used for the embodiments in FIGS. 4-7. These low but wide fins have excellent electrical characteristics as fully-depleted planar devices with the channel effectively being all (100). P channel transistor 18, used for logic, uses the (110) plane on the sidewall for benefiting mobility and thus current drive by being the full fin height. Thus, the N channel transistors function in the preferred (100) plane as planar devices while the P channel logic operates as a FinFET with the preferred (110) plane on the sidewall. The P channel pull-down functions in the (100) plane for the benefit of reliable writing of the SRAM cell.

In the embodiments shown in FIGS. 4-8, transistor 18, the P channel transistor used for logic, is made the same. The purpose is for optimizing mobility and thus current drive. P channel transistor 30 has been made differently from P channel transistor 18 in each embodiment in order to provide for a better SRAM. In each case the vertical portion of the fin is different for the P channel pull-up than for the P channel logic. In the embodiments of FIGS. 4-6 and 8 the channel along the vertical dimension of the fin is less for the P channel pull-up transistor than for the P channel logic transistor. In the embodiment of FIG. 7, the channel along the vertical dimension of the fin is of the (100) plane for the P channel pull-up transistor and is of the higher mobility (110) plane for the P channel logic transistor. In all of these examples, the portion of the channel width of the P channel logic transistor that is along the sidewalls that have the (110) plane is greater than the total of the contribution that has a surface orientation of (110) to the effective channel width of the P channel pull-down transistor.

Various other changes and modifications to the embodiments herein chosen for purposes of illustration will readily occur to those skilled in the art. For example, the material chosen for patterned dielectric layers 64 and 66 could be a different material such as nitride. Further adjustments to the various fins can be made than those described. For example, the embodiment in FIG. 8 can be further adjusted by altering the amount the height of the N channel fins as well as the widths. The N channel transistors would then receive a more significant contribution to the effective channel from the (110) plane along the sidewall. The width can be narrowed as well. The increase in height may be advantageous for increased current drive even though it is in the less favorable (110) plane. To the extent that such modifications and variations do not depart from the spirit of the invention, they are intended to be included within the scope thereof which is assessed only by a fair interpretation of the following claims.

The invention claimed is:

1. An integrated circuit, comprising:
   a memory circuit comprising:
      a first P-channel transistor, wherein the first P-channel transistor includes a first channel region;
      a first N-channel transistor coupled to the first P channel transistor, wherein the first N-channel transistor includes a second channel region; and
      a second N channel transistor functioning as a pass transistor coupled to the first P channel transistor and the first N channel transistor;
   a logic circuit comprising:
      a second P-channel transistor, the second P-channel transistor includes a third channel region, the third channel region includes a portion located along a first sidewall of a first semiconductor structure, the first sidewall of the first semiconductor structure having a surface orientation of (110), the portion of the third channel region along the first sidewall has a first vertical dimension, wherein the hole transport of the third channel region is in a generally horizontal direction, wherein the first semiconductor structure has a top surface with a surface orientation of (100);
   wherein:
      the first channel region includes a portion located along a second sidewall of the second semiconductor structure, the second sidewall of the second semiconductor structure has a surface orientation of (110), the portion of the first channel region along the second sidewall has a second vertical dimension, the second vertical dimension is less than the first vertical dimension, the second semiconductor structure has a top surface with a surface orientation of (100), and
      the second channel region includes a portion located along a third sidewall of a third semiconductor structure, the third sidewall of the third semiconductor structure has a surface orientation of (100), the structure has a top surface with a surface orientation of (100).

2. The integrated circuit of claim 1, wherein the first N-channel transistor has a greater transistor strength than a transistor strength of the first P-channel transistor.

3. An integrated circuit, comprising:
   a substrate;
   a memory circuit comprising:
      a first P-channel transistor, wherein the first P-channel transistor includes a first channel region in a first semiconductor structure above the substrate, wherein the first channel region has sidewalls, a top surface, and a first effective width;
      a first N-channel transistor coupled to the first P channel transistor; and
      a second N channel transistor functioning as a pass transistor;
   a logic circuit comprising:
      a second P-channel transistor having a second channel region located in a second semiconductor structure above the substrate, wherein:
         the second channel region has a top surface having a surface orientation of (100) and sidewalls;
         the sidewalls of the second channel region have a surface orientation of (110);
         the second channel region has a width along the sidewalls;
         the width along the sidewalls of the second channel region is greater than a total of the first effective width that has a surface orientation of (110);
   wherein:
      the first N-channel transistor has a third channel region located in a third semiconductor structure; and
      the third channel region has a top surface having a surface orientation of (100) and sidewalls having a surface orientation of (100).

4. A method of forming an integrated circuit, the method comprising:
   forming a first P-channel transistor of a memory circuit, the first P-channel transistor has a first channel region;
   forming a second P-channel transistor of a logic circuit of an integrated circuit, wherein the second P-channel transistor includes a second channel region, the second channel region includes a portion having first vertical dimension located along a first sidewall of a first semiconductor structure having a surface orientation of (110), the first semiconductor structure has a top surface having a surface orientation of (100);
   a first N-channel transistor of the memory circuit functioning as a pass transistor, wherein the first N-channel transistor includes a third channel region, the third channel region includes a portion having first vertical dimension located along a first sidewall of a second semiconductor structure having a surface orientation of (100), the second semiconductor structure has a top surface having a surface orientation of (100); and
   a second N-channel transistor of the memory circuit coupled to the first P-channel transistor;
   wherein the first vertical dimension is greater than any portion of the first channel region located along a sidewall of a third semiconductor structure having a surface orientation of (110).

* * * * *